United States Patent [19]

Anjum et al.

[11] Patent Number: 5,429,972
[45] Date of Patent: Jul. 4, 1995

[54] METHOD OF FABRICATING A CAPACITOR WITH A TEXTURED POLYSILICON INTERFACE AND AN ENHANCED DIELECTRIC

[75] Inventors: Mohammed Anjum, Austin; Klaus H. Koop, Elgin; Maung H. Kyaw, Austin, all of Tex.

[73] Assignee: Advanced Micro Devices, Inc., Sunnyvale, Calif.

[21] Appl. No.: 239,453

[22] Filed: May 9, 1994

[51] Int. Cl.$^6$ ............................................. H01L 21/265
[52] U.S. Cl. ................................. 437/47; 437/60; 437/919; 437/27; 437/24; 148/DIG. 14
[58] Field of Search ..................... 437/919, 52, 47, 60, 437/27, 24; 148/DIG. 14

[56] References Cited

U.S. PATENT DOCUMENTS

| | | | |
|---|---|---|---|
| 4,682,407 | 7/1987 | Wilson et al. | 437/24 |
| 4,774,197 | 9/1988 | Haddad et al. | 437/27 |
| 4,922,319 | 5/1990 | Fukushima | 357/51 |
| 5,043,780 | 8/1991 | Fazan et al. | 257/306 |
| 5,082,797 | 1/1992 | Ghan et al. | 437/52 |
| 5,102,832 | 4/1992 | Tuttle | 437/231 |
| 5,138,411 | 8/1992 | Sandhu | 257/296 |
| 5,191,509 | 3/1993 | Wen | 361/311 |
| 5,208,176 | 5/1993 | Ahmad et al. | 437/47 |
| 5,250,456 | 10/1993 | Bryant | 437/47 |

OTHER PUBLICATIONS

Cheung, "Plasma Immersion Ion Implantation for ULSI Processing," *Trends & Applications*, 1991, pp. 811–820.

*Primary Examiner*—Olik Chaudhuri
*Assistant Examiner*—H. Jey Tsai
*Attorney, Agent, or Firm*—Conley, Rose & Tayon

[57] ABSTRACT

An enhanced capacitor configuration is provided in which the conductive and insulative layers are formed by implantation rather than deposition. The conductive regions are implanted at dissimilar depths and the insulative region is implanted between the conductive regions to form the conductive plates and intermediate dielectric material. By implanting rather than depositing, the dielectric material remains free of pinholes and can be configured thinner than conventional dielectrics, with a higher dielectric constant (k) due to the absence of an oxide. Moreover, cross-diffusions which occur during the anneal step allow texturization of the dielectric/conductive juncture. Texturization corresponds to an increase in surface area of the capacitor and, similar to increase in dielectric constant and decrease in dielectric thickness, increases the capacitive value of the ensuing capacitor.

15 Claims, 4 Drawing Sheets

METHOD OF FABRICATING A CAPACITOR WITH A TEXTURED POLYSILICON INTERFACE AND AN ENHANCED DIELECTRIC

BACKGROUND OF THE INVENTION

1. Field of the Invention

This invention relates to integrated circuit manufacture and more particular to a capacitor with enhanced area and dielectric formed by implantation of conductive and insulative layers within a polysilicon material.

2. Background of the Relevant Art

A capacitor is an electronic component capable of storing electrical energy. A capacitor consists of two conductive plates insulated from each other by a dielectric. The capacitance value is determined by the following formula:

$$C = kA/t$$

where, C=Coulombs/Volt (Farad), k=dielectric constant of the insulator, A=area of overlay of the plates, and t=thickness of the dielectric Capacitors can be configured in many ways. The plates and adjacent dielectrics can take on a planar shape, a trenched shape, a stacked shape or a fin shape. A planar capacitor entails a dielectric placed between a pair of planar conductors, wherein the conductors can be polysilicon and/or silicon. The polysilicon and silicon are generally formed on or near the substrate topography. Each side of the plate is electrically connected to other active devices formed upon the substrate to complete the connection. In high density applications, capacitors are sometimes laid out in a trench such that the insulative and conductive regions extend into the substrate instead of across the substrate. A trench capacitor thereby occupies a substrate area roughly equal to the thickness of the dielectric and adjoining plates rather than the area of the plates. Another way in which to conserve substrate area is to stack the capacitor on top of the transistors to which they are connected. Stacking of capacitors was favorably introduced in DRAM applications where conservation of area is crucial. It is understood that "capacitor" set forth herein below comprises electrically conductive plates spaced from each other by an insulative material, wherein the plates and insulative material are arranged in a planar, trenched or stacked configuration.

An examination of capacitance value C indicates that in order to increase the capacitance, dielectric constant k and/or area A must be increased or, conversely, thickness t must be decreased. A majority of plated capacitors utilize silicon nitride as a preferred dielectric material. Silicon nitride is generally deposited from a chemical vapor deposition (CVD) chamber onto the lower conductive plate. The CVD reaction used for preparing high-temperature silicon nitride is as follows: $3SiH_4 + NH_3 \rightarrow Si_3N_4 + 12H_2$. Silicon nitride is relatively impermeable to oxygen (as well as phosphorous and boron) and provides an efficient barrier against diffusion between the plates. More importantly, silicon nitride has a dielectric constant K much higher than, for example, silicon dioxide. While silicon nitride is the preferred dielectric, silicon nitride often exhibits numerous pinholes which may or may not extend through the nitride. Regardless of the CVD techniques used, silicon nitride remains more prone to pinholes that other dielectrics. Pinholes, resulting from deposition, must be avoided in order to ensure the conductive plates do not short to one another.

If the designer wishes to increase capacitance by decreasing dielectric thickness t, then he or she must address the problem of pinholes. As the deposited layer of silicon nitride becomes thinner, the propensity for catastrophic pinholes increases. Thus, a trade-off exists between dielectric enhancement (thickness minimization) and the presence of pinholes. Existing silicon nitride layers require a dielectric thickness placed upon the lower plate of generally more than 100 Angstroms in order to prevent substantial occurrence of pinholes. After the silicon nitride is deposited, a wet oxidation step is used to fill the pinholes. Thereafter, a second conductive plate of, for example, polysilicon is deposited over the silicon nitride dielectric to complete the plated capacitor configuration. Accordingly, conventional capacitors utilize four deposition steps: a first conductive deposition step, followed by an insulative deposition step, followed by a wet oxide step, followed by a second conductive deposition step. All four steps require two separate masking and photolithography steps thereby adding to the complexity of the manufacturing process. Moreover, the plated structure results in a relatively thick combination of conductive and insulative layers which, if placed on an even substrate surface, substantially adds to the unevenness of the circuit topography. Subsequent planarization steps involving selective removal of overlaying oxide and/or application of spin-on glass (SOG) are needed to re-planarize the upper surface.

In addition to increasing dielectric constant K and/or decreasing thickness t, capacitance C can be increased by increasing area A. Recent work has been performed in the area of texturization, in which additional area is provided at the juncture between the insulative layer and one of the adjacent conductive layers. Specifically, the conductive layer can be texturized after it has been deposited by growing a sacrificial oxide upon the upper surface of the conductive (generally polysilicon) layer. Doping of the underlying polysilicon prior to oxide growth enhances oxide growth rate and, when performed at a specific temperature, leads to a roughness or texture in the areas at which oxide is grown. Oxide grown upon the exposed surface of the deposited polysilicon is then removed leaving a roughened or textured upper surface on which silicon nitride is subsequently placed. The method of polysilicon texturization to enhance capacitor surface area is well studied and set forth in U.S. Pat. Nos. 5,043,780 to Fazan, et al.; 5,082,797 to Ghan, et al.; 5,102,832 to Tuttle; 5,138,411 to Sandhu; 5,191,509 to Wen; and 5,208,176 to Ahmad, et al. All of the above teach the importance of texturization, but in the context of depositing a polysilicon layer to be textured followed by deposition of a dielectric and another polysilicon thereover. For reasons stated above, deposition of separate layers not only is time consuming, costly and burdensome, but also increases the chances of pinholes existing in the dielectric as well as gross contamination occurring on the textured polysilicon before silicon nitride deposition. Any pinholes or contamination (which can lead to pinholes) existing within the dielectric will deleteriously effect capacitor performance regardless of any advantages of texturization. Accordingly, it would be advantageous to provide a processing methodology in which a capacitor is formed absent deposition of each layer (conductive and insulative layers). It would be further desirable to obtain the benefits of silicon nitride, as the dielectric at textured junctures, without having to undergo the disadvantages of pinholes, contamination, and added processing steps associated with layer-by-layer deposition.

SUMMARY OF THE INVENTION

The problems outlines above are in large part solved by the improved capacitor process/methodology of the present invention. That is, the manufacturing process hereof comprises a capacitor which is entirely formed by impurity implantation into a single polysilicon layer, rather than by deposition of layers. Specifically, the present capacitor structure is formed by implanting conductive layers on opposite sides of an implanted insulative layer, wherein the insulative layer is substantially thinner than conventional insulative layers and which utilizes the advantages of silicon nitride. Careful selection of implant energies and dosages allows a capacitor to be formed by implanting a first conductive layer of phosphorous adjacent an implanted, insulative layer of nitrogen. Thereafter, a second conductive layer of phosphorous is implanted adjacent the nitrogen layer and opposite the first conductive layer to complete the plated capacitor structure. The capacitor is activated by annealing phosphorous atoms and the nitrogen atoms toward silicon atoms. Proper placement of nitrogen atoms within the polysilicon bulk allows more precise control over the thickness of the ensuing silicon nitride dielectric and also ensures that silicon nitride extends along the entire region between the phosphorous layers in a uniform manner. Thus, silicon nitride (from a nitrogen implant source) can be relatively thin and substantially void of pinholes and contamination often encountered in conventional non-implanted, layer-by-layer deposition techniques. Further, conventional wet oxidation step, masks, etc. are avoided. Without being bound to theory, it is postulated that texturization arises during the anneal process, whereby phosphorous and nitrogen atoms diffuse across the juncture between the insulative and conductive layers to form a textured, rough or uneven line of demarcation between said layers. Uneven demarcation arising from cross-diffusion allows for an increase in the available area of the capacitor thereby enjoying the benefits of conventional texturization but without the associated problems.

Broadly speaking, the present invention contemplates a method for fabricating a capacitor comprising the steps of forming an upper surface topography upon a semiconductor substrate and thereafter depositing a polysilicon layer upon the upper surface topography. A first plurality of phosphorous ions are then implanted into the polysilicon layer to a concentration peak density at a first depth relative to the upper surface of the polysilicon layer. The first plurality of polysilicon ions are implanted at a beam energy sufficient to amorphize a region of the polysilicon layer to a depth greater than the first depth. A plurality of nitrogen atoms are then implanted into the polysilicon layer to a concentration peak density at a second depth relative to the upper surface of the polysilicon layer. The second depth is less than the first depth, and the nitrogen ions are implanted only within the amorphized region to prevent channelling of the nitrogen ions to a depth equal to or less than the first depth. A second plurality of polysilicon ions are then implanted into the polysilicon layer to a concentration peak density at a third depth relative to the upper surface of the polysilicon layer. The third depth is less than the second depth, and the second plurality of phosphorous ions are implanted only within the amorphized region to prevent channelling of the second plurality of phosphorous ions to a depth equal to or greater than the second depth. The polysilicon layer is then annealed to form a capacitor comprising an insulative silicon nitride layer of implanted nitrogen ions combined with silicon atoms and configured between a conductive first and second phosphorous layer of respective implanted first and second plurality of phosphorous ions. A juncture between the silicon nitride layer and both phosphorous layers are textured as a result of diffusion of silicon nitride and phosphorous across the juncture and, further, wherein the silicon nitride occupies diffusion sites within the conductive silicon nitride layer such that electrically conductive paths within the silicon nitride are substantially eliminated.

The upper surface topography is formed by growing a field oxide and a gate oxide upon the substrate, depositing a conductor upon the field and gate oxides, and depositing a dielectric upon the conductor. The dielectric may include oxide formed on the substrate upper surface as well as polysilicon upper surface to electrically separate the polysilicon conductor from the overlying capacitor.

The annealing step generally includes the steps of subjecting the polysilicon layer to a temperature exceeding 600° C. and for a time period exceeding several seconds. Resulting from the heating of the polysilicon layer, the amorphize region recrystallizes and the combination of nitrogen and silicon atoms diffuse across the juncture. Moreover, nitrogen combines with silicon atoms to form silicon nitride having a dielectric constant greater than 3.0. Diffusion across the juncture allows for a texturized interface and provides enhanced surface area of the capacitor. Still further, the silicon nitride insulative layer is substantially free of conductive paths or pinholes between the adjacent conductive layers. By implanting the dielectric rather than depositing it, the dielectric is virtually free of pinholes and has a suitable dielectric constant.

BRIEF DESCRIPTION OF THE DRAWINGS

Other objects and advantages of the invention will become apparent upon reading the following detailed description and upon reference to accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 1:
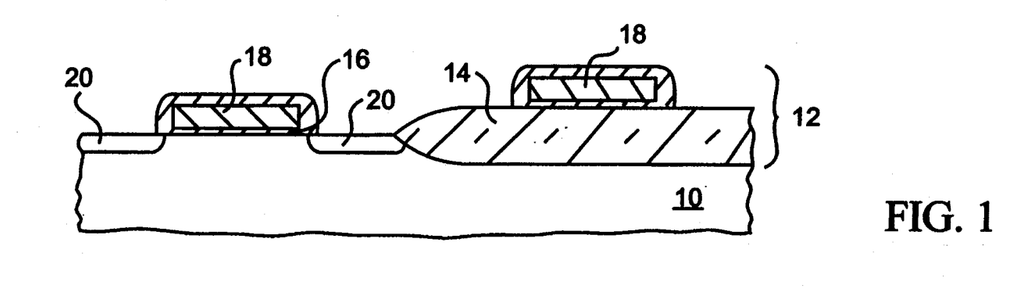
FIG. 1 is a cross-sectional view of a partial upper surface topography of a semiconductor substrate according to the present invention.

Turning now to the drawings, FIG. 1 is a cross-sectional view of a semiconductor substrate 10, upon which an upper surface topography 12 is formed. Substrate 10 can be either n-type or p-type and can include various reverse-doped well regions known in MOS or bipolar technologies. Topography 12 includes at least one field oxide region 14 and at least one gate oxide region 16. Deposited upon field and gate oxide 14 and 16, respectively, are conductors 18. Conductors 18 can be made of any conductive material, including polycrystalline (polysilicon). Conductors 18 in active regions form a template for implanting self-aligned source/drain or emitter/collector regions 20.

Figure 2:
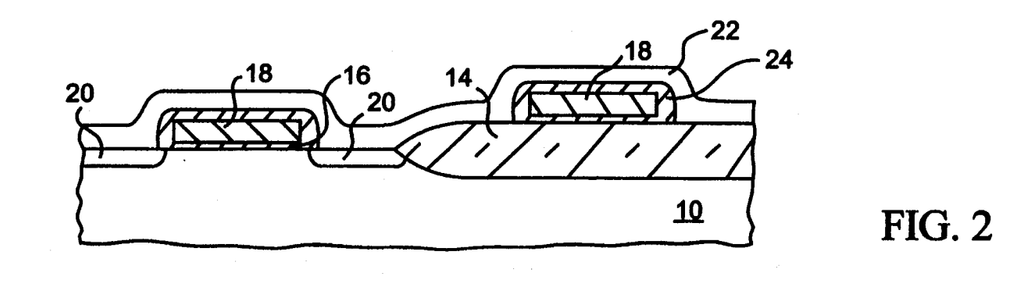
FIG. 2 is a cross-sectional view of the partial upper surface topography having a polysilicon layer deposited thereon according to the present invention.

Upper surface topography 12 contains many peaks and valleys upon which subsequent layers are deposited. The peaks and valleys may lend to extreme disparities in the planarization of the upper surface. Rather than having to deposit numerous layers and, in some instances, relatively thin layers upon the upper surface, only one relatively thick polysilicon layer 22 is deposited according to the present invention, as shown FIG. 2. Polysilicon layer 22 is according to an exemplary embodiment approximately 1000 Angstroms thick and is deposited according to chemical vapor deposition (CVD) techniques. In order to maintain relatively small grain size, CVD occurs within a chamber heated at approximately 500° C. to 600° C. An appropriate temperature is selected in order to minimize grain size but shall not be so small as would substantially increase the resistivity of polysilicon 22. As shown in FIG. 2, polysilicon 22 is deposited across the entire surface of topography 12 and is insulated from conductors 18 by a previously grown oxide layer 24.

Figure 3:
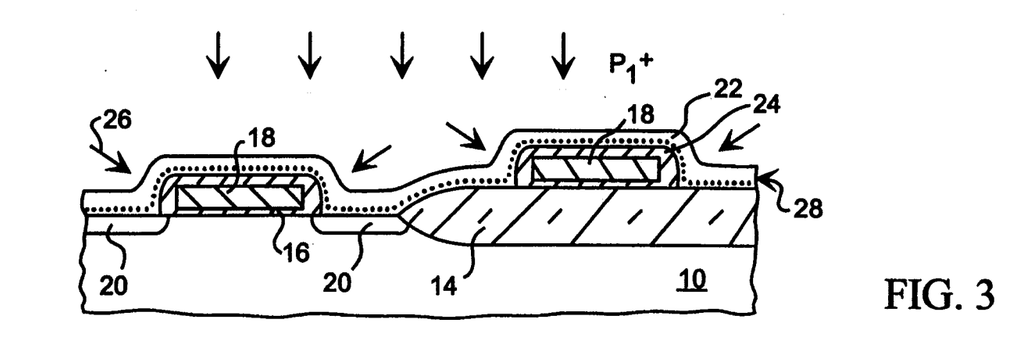
FIG. 3 is a cross-sectional view of the polysilicon layer configured to receive a first plurality of phosphorous ions according to the present invention.

Referring to FIG. 3, a subsequent processing step is shown, whereby the upper surface polysilicon 22 receives a first plurality of phosphorous ions $P_1$. Phosphorous ions $P_1$ are implanted from an ion implanter, preferably a medium to very low energy implanter. Phosphorous ions $P_1$ are implanted using plasma immersion implantation techniques generally described in Cheung, "Plasma immersion ion implantation for ULSI processing." Trends & Applications, 1991, pp. 811-820 (herein incorporated by reference). Plasma immersion implantation allows for even implantation at areas perpendicular to substrate 10 as well as areas which are angled relative to substrate 10, as shown by arrows 26. By using plasma immersion techniques, phosphorous ions $P_1$ are implanted evenly along the uneven polysilicon layer 22. Preferably, the phosphorous ions are accelerated at a beam current and time period selected such that the implanted ions achieve a dose within polysilicon 22 equal to or greater than approximately $1 \times 10^{15}$ atoms/cm². Moreover, phosphorous ions are implanted at an energy of approximately 40 keV such that the ions are implanted within polysilicon 22 at a first depth 28 of approximately 520 Angstroms relative to the upper surface of polysilicon 22. The peak concentration appears approximately equal to $1.9 \times 10^{22}$ cm$^{-3}$ and with $\Delta Rp = 207$ Angstroms. The "upper surface" of polysilicon is defined as the surface upon which the implanted ions initially strike the polysilicon. Thus, the upper surface includes the exposed upper surface, regardless of whether the exposed surface is parallel with or arranged at an angle with substrate 10.

Figure 4:
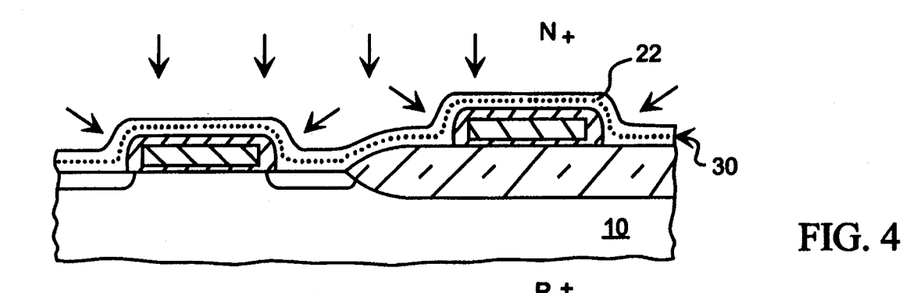
FIG. 4 is a cross-sectional view of the polysilicon layer configured to receive a plurality of nitrogen ions according to the present invention.

Phosphorous ions $P_1$ are necessary to implant dopant atoms into polysilicon 22. The minority carriers are subsequently activated by an anneal step described herein below. After phosphorous ions $P_1$ are implanted, a subsequent processing step, shown in FIG. 4, is needed to form an insulative layer adjacent to the previously deposited phosphorous layer. FIG. 4 illustrates a cross-sectional view of polysilicon 22 configured to receive nitrogen ions N. Nitrogen ions are implanted according to plasma immersion techniques to a fairly high dosage in order to subsequently bring about a combination with silicon atoms at the implant sites, wherein the combination of silicon and nitride form silicon nitride in stoichiometric or near stoichiometric proportions. Preferably, nitrogen ions are implanted at a dose of approximately $5 \times 10^{15}$ atoms/cm² and at an implant energy of 2.4 keV. The implant energy is chosen such that a concentration peak density of the implanted nitrogen is at a second depth 30 relative to the upper surface polysilicon 22. The peak concentration appears approximately equal to $3.9 \times 10^{23}$ cm$^{-3}$, and $\Delta Rp$ is approximately equal to 51 Angstroms. Second depth 30 is approximately 80 Angstroms, as measured from the upper surface, and is less than the first depth 28.

Figure 5:
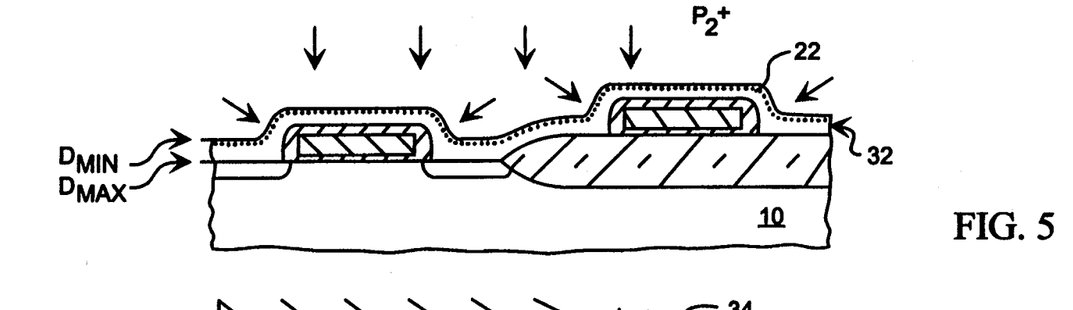
FIG. 5 is a cross-sectional view of the polysilicon layer configured to receive a second plurality of phosphorous ions according to the present invention.

After nitrogen ions are implanted at second depth 30, a second plurality of phosphorous ions $P_2$ are implanted into polysilicon 22 to a third depth 32, as shown in FIG. 5. Phosphorous ions $P_2$, similar to phosphorous $P_1$ and nitrogen ions N, are implanted according to plasma immersion techniques to ensure uniform implantation within polysilicon 22 regardless of the angle of implantation or the upper surface configuration of the target surface. Phosphorous ions $P_2$ are implanted at a dose of approximately $1 \times 10^{13}$ atoms/cm² and at an implant energy of 0.5 keV. The implant energy is chosen such that the concentration peak density at third depth 32 is approximately at a depth of 22 Angstroms as measured from the upper surface of polysilicon 22. The peak concentration appears approximately equal to $3.1 \times 10^{21}$ cm$^{-3}$, and $\Delta Rp$ is approximately equal to 13 Angstroms. As appreciated from FIGS. 3-5, first depth 28 is less than second depth 30, and second depth 30 is less than third depth 32. By carefully controlling implant energies and dosages of the three implant steps, a high performance capacitor can be formed with a thin insulative layer placed between conductive layers as described hereinbelow. The dosages, depths, energies and $\Delta Rp$ shown and described are merely exemplary as to one embodiment and can be varied provided overall structure remains with relative proportions and depths (first, second and third depths).

Figure 6:
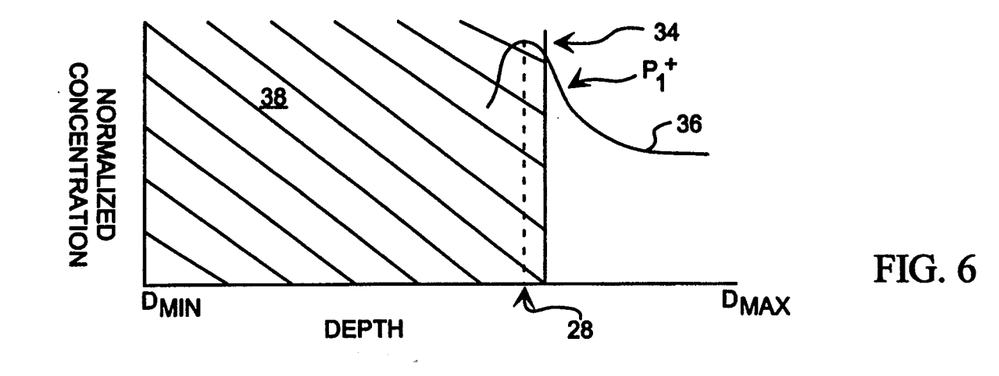
FIG. 6 is a graph of ion concentration verses depth for the first plurality of phosphorous ions implanted according to the present invention.

Referring to FIG. 6, a graph of ion concentration verses depth for the first plurality of phosphorous ions $P_1$ is shown. Phosphorous ions $P_1$ are implanted at a concentration peak density 34 corresponding to first depth 28. Depth 28 (often referred to as "range," or "R") is determined by incremental energy loss resulting from nuclear $S_n$ and electronic $S_c$ stopping power. Projected range is characterized by its mean value (centered at the maximum concentration point) as well as by the standard deviation, or $\Delta Rp$, along the direction of the incident ion. The latter term of standard deviation is sometimes characterized as "straggle". In general, the standard deviation decreases as the implant energy increases and as the atomic number of the implanted species increases. Typically, lighter ions have a larger relative dispersion at low energies than heavy ions. Phosphorous, being a heavier ion than nitrogen, will thereby display a lesser standard deviation than nitrogen. Nonetheless, the concentration curve density for phosphorous ions $P_1$ shown in FIG. 6, are not entirely Gaussian. Instead, a tail 36 will exist evidencing ion straggle in the forward direction of implant. Ion straggle in the forward direction is often characterized as ion "channeling". Channeling is a well known phenomena and results from the steering of ions through the semiconductor lattice along areas where energy loss is minimum. Channeled beams result in greatly increased penetration depth as illustrated by tail 36. Channeling is prevalent whenever ions are implanted into a single crystal lattice or into a polycrystalline lattice. After the lattice is amorphized or "preamorphized" channeling becomes less prevalent since there is no defined pattern through which the ions can be channeled. High energy implantation of first plurality of phosphorous ions $P_1$ amorphizes or "preamorphizes" the lattice structure in the cross-hatched area 38. Amorphized region 38 is thereafter advantageously used to prevent or substantial minimize channelling and any tail effects therefrom whenever subsequent implantation occurs.

Figure 7:
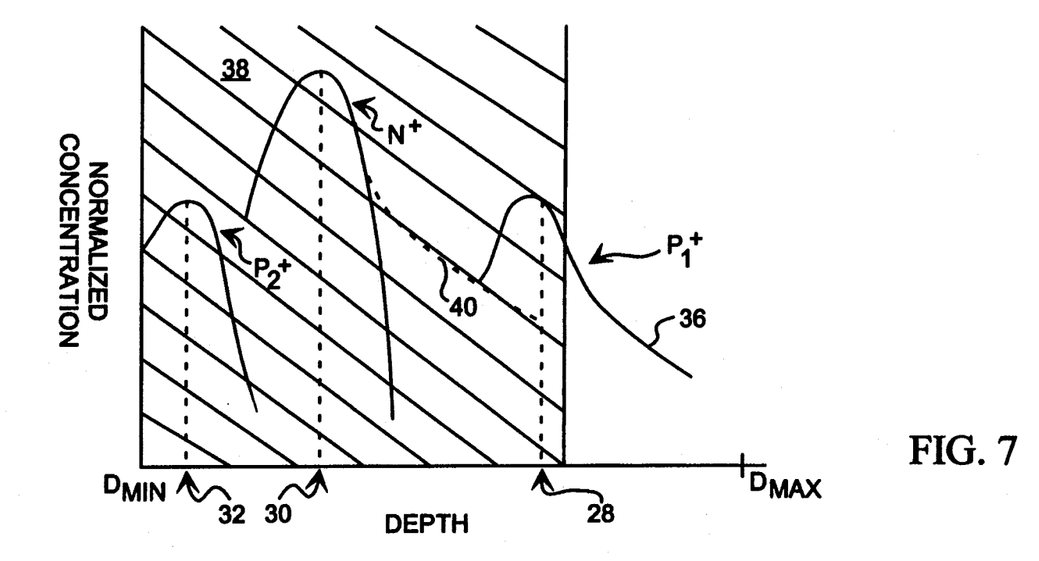
FIG. 7 is a graph of ion concentration verses depth for the first and second plurality of phosphorous ions and the nitrogen ions implanted according to the present invention.

Referring to FIG. 7, a graph of ion concentration verses depth for the first and second plurality of phosphorous ions $P_1$ and $P_2$ as well as the plurality of nitrogen ions N, are shown. High energy implantation of phosphorous ions $P_1$ to first depth 28 forms an amorphized region 38 in which subsequent ions of nitrogen N and phosphorous $P_2$ are implanted. Nitrogen ions are implanted at a concentration peak density at second depth 30, which is less than the first depth 28. Thereafter, phosphorous ions $P_2$ are implanted at a concentration peak density at a third depth 32 less than respective second and first depths 30 and 28.

An important advantage of the present invention is implantation of nitrogen necessary to form a thin dielectric layer centered about second depth 30. Nitrogen ions N are implanted in amorphized region 38 such that little if any channeling or tail affects occur. In particular, the edge or deepest part of implantation is substantially less for the implanted nitrogen ions than it would be if the nitrogen were implanted in a non-preamorphized polysilicon. Thus, nitrogen does not experience a tail 40, as shown in FIG. 7 in phantom. Unlike tail 36 formed by $P_1$ implant into non-preamorphized polysilicon, there is substantially no tail of nitrogen and phosphorous $P_2$ implanted in amorphous region 38. Absence of a tail in subsequently implanted nitrogen N and phosphorous $P_2$ ensures a fine line demarcation between the implanted regions such that the implanted regions do not overlap one another. It is important that the implanted regions which form the insulative and conductive layers be separate from one another in order that subsequent anneal not lessen the conductive and insulative properties of the ensuing layers.

Figure 8:
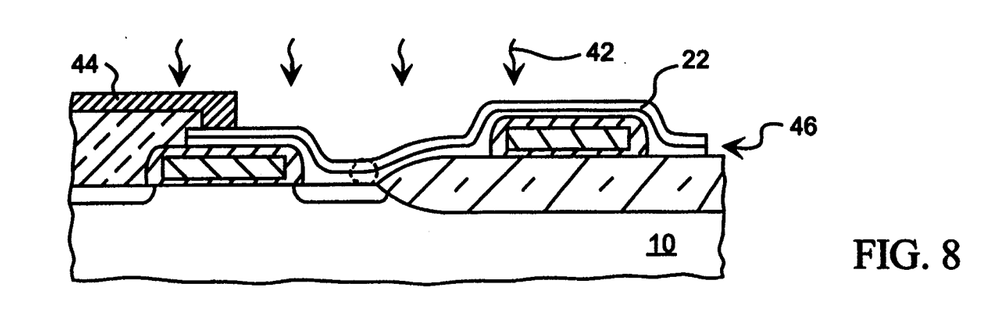
FIG. 8 is a cross-sectional view of the partial upper surface topography with overlying polysilicon layer and patterned metal contacts annealed according to the present invention.

Referring now to FIG. 8, an annealing step is used to recrystallize the amorphous region 38 and to anneal out lattice damage caused by the implantation step. By applying heat to substrate 10, topography 12 and polysilicon 22, the composite (implanted) polysilicon layer 22 takes on capacitor characterizes. Namely, the implanted phosphorous ions $P_1$ and $P_2$ become electrically active and become conductive when current is applied via, e.g., a metal layer 44 contacted therewith. High concentrations of nitrogen atoms in and around second depth 30 combine with silicon atoms to form a silicon nitride of stoichiometric or nearly stoichiometric proportions. Although the silicon nitride is derived from implantation, it achieves the same advantages of deposited thin film silicon nitride. However, implanted silicon nitride is void of pinholes often present in conventional silicon nitride layers. Moreover, the nitride can be implanted with very small standard deviation to achieve an extremely thin silicon nitride layer. The silicon nitride layer can, in the present instance be 50 angstroms or less in thickness. By minimizing channeling or tailing of the implanted nitride, thin silicon nitride dielectric formation is ensured. The silicon nitride is preferably formed as a layer 46 near the middle of the thickness of polysilicon 22. By decreasing energy to a very small amount, the peak carrier concentration of nitrogen is very high for a given dose greater than or equal to $1 \times 10^{22}$.

Figure 9:
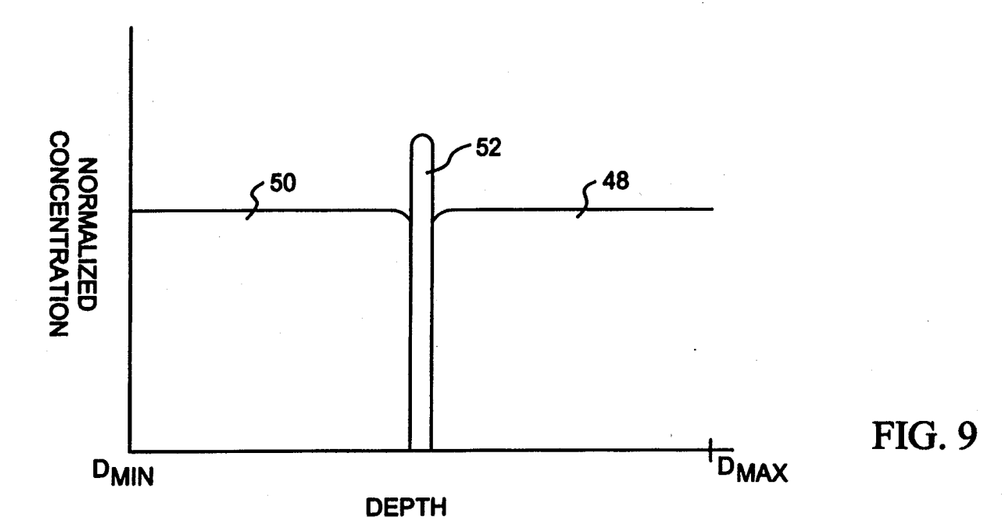
FIG. 9 is a graph of ion concentration verses depth for the first and second plurality of phosphorous ions and the nitrogen ions implanted and thereafter annealed according to the present invention.

Referring now to FIG. 9, a graph of ion concentration verses depth is shown after an anneal step for implanted phosphorous $P_1$ and $P_2$ as well as implanted nitrogen N. Concentration of nitrogen remains higher than concentration of phosphorous ions $P_1$ and $P_2$. The peak densities are reduced and extended substantially across the respective conductive and insulative regions. Phosphorous ions $P_1$ form the lower conductive plate 48, phosphorous $P_2$ form the upper conductive plate 50, and nitrogen combined with silicon, forms the intermediate insulative material 52. At the juncture between conductive plate 48 and insulative material 52 is a slight decrease in phosphorous concentration. Likewise, at the interface between conductive plate 50 and insulative material 52, a slight decrease in phosphorous concentration is shown. Phosphorous ions $P_1$ can be used to form a source/drain n+region.

Figure 10:
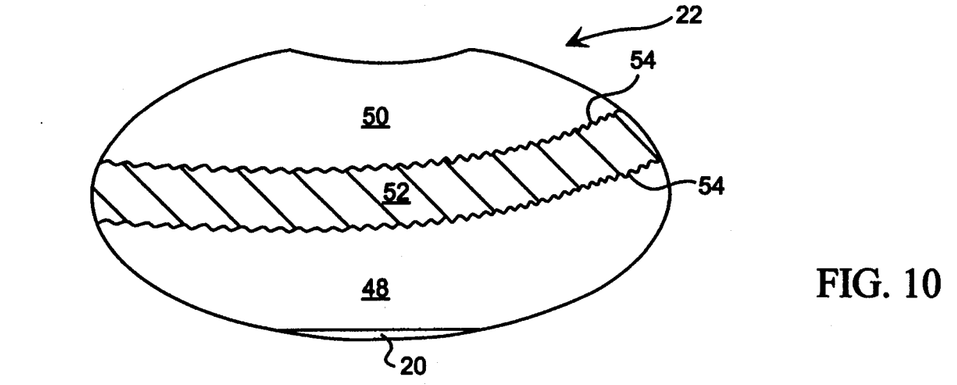
FIG. 10 is a detailed view along area 10 of FIG. 8 illustrating a textured juncture between the implanted conductive layers of polysilicon and the implanted insulative layer of polysilicon according to the present invention.

Part of the reason for the decrease in phosphorous concentration is due to cross-diffusion of nitrogen and phosphorous at the juncture. As shown in FIG. 10, diffusion across the juncture causes a textured demarcation between each region. The textured junction provides enhancement in the surface between the insulative and conductive regions. An increase in area, as shown by the textured juncture 54 causes a corresponding direct increase in capacitance. The detailed drawing of FIG. 10 is illustrative of a small portion of polysilicon 22, taken from FIG. 8. The remaining portions of polysilicon 22 demonstrate similar texturization between insulative region 52 and conductive regions 48 and 50. By implanting rather than depositing the insulative and conductive regions, the present methodology can avoid contamination caused by deposition and thereby minimize any pinholes in the insulative region which would deleteriously affect capacitor operation. More importantly, the entire capacitor configuration can be formed from a single polysilicon layer which is preferably quite thin, e.g., approximately 1,000 Angstroms.

It will be appreciated to those skilled in the art having the benefit of this disclosure that this invention is believed to be capable of applications with any integrated circuit embodying a plated capacitor, and plated capacitor can be configured as planar, trenched or stacked. Furthermore, it is also to be understood that the form of the invention shown and described is to be taken as a presently preferred embodiment. Various modifications and changes may be made to each and every processing step as would be obvious to a person skilled in the art having benefit of this disclosure without departing from the spirit and scope of the invention as set forth in the claims. It is intended that the following claims be interpreted to embrace all such modifications and changes and, accordingly, the specifications and drawings are to be regarded in an illustrative rather than a restrictive sense.

What is claimed is:

1. A method for fabricating a capacitor comprising the steps of:
    forming an upper surface topography upon a semiconductor substrate;
    depositing a polysilicon layer upon said upper surface topography;
    implanting a first plurality of phosphorous ions into said polysilicon layer to a concentration peak density at a first depth relative to the upper surface of said polysilicon layer, wherein said first plurality of phosphorous ions are implanted at a beam energy sufficient to amorphize a region of said polysilicon layer to said first depth;
    implanting a plurality of nitrogen ions into said polysilicon layer to a concentration peak density at a second depth relative to the upper surface of said polysilicon layer, wherein said second depth is less than said first depth and wherein said nitrogen ions are implanted only within said amorphized region to prevent channeling of said nitrogen ions to a depth greater than said first depth;
    implanting a second plurality of phosphorous ions into said polysilicon layer to a concentration peak density at a third depth relative to the upper surface of said polysilicon layer, wherein said third depth is less than said second depth and wherein said second plurality of phosphorous ions are implanted only within said amorphized region to prevent channeling of said second plurality of phosphorous ions to a depth greater than said second depth; and
    annealing said polysilicon layer to form a capacitor comprising an insulative silicon nitride layer of implanted said nitrogen ions combined with a plurality of silicon atoms to form silicon nitride between a conductive first and second phosphorous layers of respective implanted first and second plurality of phosphorous ions, wherein a juncture between said silicon nitride layer and said phosphorous layers is textured as a result of diffusion of said silicon nitride and phosphorous across said juncture and, further, wherein said silicon nitride occupies diffusion sites within a layer of said silicon nitride such that electrically conductive paths within said layer of silicon nitride are substantially eliminated.

2. The method as recited in claim 1, wherein said step of forming an upper surface topography comprises growing field oxide and gate oxide regions upon said substrate, depositing a conductor upon said field oxide and gate oxide, and depositing a dielectric upon said conductor.

3. The method as recited in claim 1, wherein said step of implanting a first plurality of phosphorous ions comprises:
    ionizing elemental phosphorous; and
    accelerating the phosphorous ions at a dose exceeding $1 \times 10^{15}$ atoms/cm$^2$ and at an implant energy of 40 keV, whereby the concentration peak density of the first plurality of phosphorous ions residing within the polysilicon as atoms is at a depth of 520 Angstroms.

4. The method as recited in claim 1, wherein said step of implanting a plurality of nitride ions comprises:
    ionizing elemental nitrogen; and
    accelerating the nitrogen ions at a dose of $5 \times 10^{15}$ atoms/cm$^2$ and at an implant energy of 2.4 keV, whereby the concentration peak density of the first plurality of phosphorous ions residing within the polysilicon as atoms is at a depth of 80 Angstroms.

5. The method as recited in claim 1, wherein said step of implanting a second plurality of phosphorous ions comprises:
    ionizing elemental phosphorous; and
    accelerating the phosphorous ions at a dose of $1 \times 10^{13}$ atoms/cm$^2$ and at an implant energy of 0.5 keV, whereby the concentration peak density of the first plurality of phosphorous ions residing within the polysilicon as atoms is at a depth of 22 Angstroms.

6. The method as recited in claim 1, wherein said annealing step comprises:
    subjecting said polysilicon layer to a temperature exceeding 600° C. and for a time period exceeding several seconds; and
    resulting from the immediately preceding step, recrystallizing said amorphized region and diffusing said nitrogen to silicon atoms to form said silicon nitride having a dielectric constant greater than 3.0.

7. The method as recited in claim 1, further comprising the steps of:
    selectively removing said polysilicon layer and forming a contact window onto a region of the upper surface of said polysilicon layer; and
    depositing a metal layer into said contact window to complete electrical connection to one of said phosphorous layers.

8. The method as recited in claim 1, wherein said steps of implanting a plurality of nitride ions and a first and second plurality of phosphorous ions comprises implanting using plasma immersion.

9. A method for fabricating a capacitor comprising the steps of:
    forming an upper surface topography upon a semiconductor substrate;

depositing a polysilicon layer upon said upper surface topography;

implanting a first plurality of phosphorous ions to a concentration peak density at a first depth of 520 Angstroms relative to the upper surface of said polysilicon layer, at a dose exceeding $1 \times 10^{15}$ atoms/cm$^2$, and at an implant energy of 40 keV sufficient to amorphize a region of said polysilicon layer to a depth greater than said first depth;

implanting a plurality of nitrogen ions to a concentration peak density at a second depth of 80 Angstroms relative to the upper surface of said polysilicon layer, at a dose of $5 \times 10^{15}$ atoms/cm$^2$, and at an implant energy of 2.4 keV, wherein said nitrogen ions are implanted only within said amorphized region to prevent channeling of said nitrogen ions to a depth greater than said first depth;

implanting a second plurality of phosphorous ions to a concentration peak density at a third depth of 22 Angstroms relative to the upper surface of said polysilicon layer, at a dose of $1 \times 10^{13}$ atoms/cm$^2$, and at an implant energy of 0.5 keV, wherein said second plurality of phosphorous ions are implanted only within said amorphized region to prevent channeling of said second plurality of phosphorous ions to a depth greater than said second depth; and annealing said polysilicon layer to form a capacitor comprising an insulative silicon nitride layer of implanted nitrogen ions combined with silicon atoms and configured between a conductive first and second phosphorous layer of respective implanted first and second plurality of phosphorous ions, wherein a juncture between said silicon nitride layer and said phosphorous layers is textured as a result of diffusion of silicon nitride and phosphorous across said juncture and, further, wherein said silicon nitride occupies diffusion sites within said conductive silicon nitride layer such that electrically conductive paths within said silicon nitride are substantially eliminated.

10. The method as recited in claim 9, wherein said step of forming an upper surface topography comprises growing field oxide and gate oxide regions upon said substrate, depositing a conductor upon said field oxide and gate oxide, and depositing a dielectric upon said conductor.

11. The method as recited in claim 9, wherein said textured juncture between said phosphorous layers and said silicon nitride results in an increase in area of said capacitor.

12. The method as recited in claim 9, wherein said conductive silicon nitride is substantially void of conductive paths therewithin.

13. The method as recited in claim 9, wherein said annealing step comprises:

subjecting said polysilicon layer to a temperature exceeding 600° C. and for a time period exceeding several seconds; and resulting from the immediately preceding step, recrystallizing said amorphized region and diffusing said nitrogen to silicon atoms to form said silicon nitride having a dielectric constant greater than 3.0.

14. The method as recited in claim 9, further comprising the steps of:

selectively removing said polysilicon layer and forming a contact window onto a region of the upper surface of said polysilicon layer; and depositing a metal layer into said contact window to complete electrical connection to one of said phosphorous layers.

15. The method as recited in claim 9, wherein said steps of implanting a plurality of nitrogen ions and a first and second plurality of phosphorous ions comprises implanting using plasma immersion.

* * * * *

UNITED STATES PATENT AND TRADEMARK OFFICE
CERTIFICATE OF CORRECTION

PATENT NO. : 5,429,972

DATED : July 4, 1995

INVENTOR(S) : Mohammed Anjum, et al.

It is certified that error appears in the above-indentified patent and that said Letters Patent is hereby corrected as shown below:

Claim 6, col. 10, line 46, please delete "600° C." and substitute therefor --600° C--.

Claim 13, col. 12, line 19, please delete "600° C." and substitute therefor --600° C--.

Signed and Sealed this

Tenth Day of October, 1995

*Attest:*

BRUCE LEHMAN

*Attesting Officer*     Commissioner of Patents and Trademarks